United States Patent
Kim et al.

(10) Patent No.: US 12,341,033 B2
(45) Date of Patent: Jun. 24, 2025

(54) APPARATUS FOR SEPARATING SEMICONDUCTOR CHIP AND METHOD FOR SEPARATING SEMICONDUCTOR BY USING SAME

(71) Applicant: LG CHEM, LTD., Seoul (KR)

(72) Inventors: Eun Bum Kim, Daejeon (KR); Ju Hyeon Kim, Daejeon (KR); Kwang Joo Lee, Daejeon (KR); Jung Hak Kim, Daejeon (KR); Yoon Sun Jang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 169 days.

(21) Appl. No.: 17/794,370

(22) PCT Filed: Feb. 4, 2021

(86) PCT No.: PCT/KR2021/001495
§ 371 (c)(1),
(2) Date: Jul. 21, 2022

(87) PCT Pub. No.: WO2021/158042
PCT Pub. Date: Aug. 12, 2021

(65) Prior Publication Data
US 2023/0051048 A1 Feb. 16, 2023

(30) Foreign Application Priority Data
Feb. 6, 2020 (KR) .................. 10-2020-0014526

(51) Int. Cl.
*H01L 21/67* (2006.01)
*C09J 7/10* (2018.01)
(Continued)

(52) U.S. Cl.
CPC .......... *H01L 21/67132* (2013.01); *C09J 7/10* (2018.01); *C09J 11/00* (2013.01); *H01F 1/44* (2013.01);
(Continued)

(58) Field of Classification Search
CPC .......... H01L 21/67132; H01L 21/6836; H01L 21/6838; C09J 7/10; C09J 11/00;
(Continued)

(56) References Cited

U.S. PATENT DOCUMENTS

| 10,242,977 B2 | 3/2019 | Sasaki et al. |
| 2005/0255673 A1 | 11/2005 | Cheung et al. |

(Continued)

FOREIGN PATENT DOCUMENTS

| CN | 100373536 A | 11/2005 |
| JP | H11-330012 A | 11/1999 |

(Continued)

OTHER PUBLICATIONS

International Search Report dated Jun. 3, 2021, issued in the corresponding International Application No. PCT/KR2021/001495, 10 pages.

*Primary Examiner* — Andrew L Swanson
(74) *Attorney, Agent, or Firm* — ROTHWELL, FIGG, ERNST & MANBECK, P.C.

(57) ABSTRACT

Disclosed are an apparatus and a method for separating a semiconductor chip disposed on a base member via an adhesive member from the base member. The method includes: a step of providing a push member on a side of the base member opposite to a side on which the semiconductor chip is disposed and moving the push member in a direction towards the semiconductor chip; and a step of separating the semiconductor chip, moved together with the push member, from the base member through a pick-up unit. The adhesive (Continued)

member and the push member are each magnetized such that repulsive forces act on each other.

13 Claims, 2 Drawing Sheets

(51) Int. Cl.
  *C09J 11/00*        (2006.01)
  *H01F 1/44*         (2006.01)
  *H01L 21/683*       (2006.01)
(52) U.S. Cl.
  CPC ...... *H01L 21/6836* (2013.01); *H01L 21/6838* (2013.01); *C09J 2203/326* (2013.01); *C09J 2301/408* (2020.08); *C09J 2301/502* (2020.08)
(58) Field of Classification Search
  CPC ............ C09J 2301/408; C09J 2301/502; C09J 2203/326; H01F 1/44
  See application file for complete search history.

(56) References Cited

U.S. PATENT DOCUMENTS

| | | | | |
|---|---|---|---|---|
| 2008/0160725 | A1* | 7/2008 | Byun | ............... H01L 24/83 438/464 |
| 2015/0279716 | A1 | 10/2015 | Ko | |
| 2016/0172253 | A1* | 6/2016 | Wu | ............... H01L 24/81 335/291 |
| 2016/0268491 | A1* | 9/2016 | Wu | ............... H01L 24/81 |
| 2018/0226281 | A1* | 8/2018 | Sogou | ............... H01L 21/67132 |
| 2018/0374987 | A1* | 12/2018 | Zou | ............... H01L 21/67132 |
| 2019/0181029 | A1* | 6/2019 | Matsuzaki | ............... H01L 21/78 |
| 2020/0027764 | A1 | 1/2020 | Monser et al. | |
| 2020/0362209 | A1 | 11/2020 | Jang et al. | |

FOREIGN PATENT DOCUMENTS

| | | |
|---|---|---|
| JP | 2001-326195 A | 11/2001 |
| JP | 5271972 B | 8/2013 |
| JP | 2015-185762 A | 10/2015 |
| JP | 2015-198251 A | 11/2015 |
| JP | 2016-032061 A | 3/2016 |
| JP | 2018-181929 A | 11/2018 |
| JP | 2019-106435 A | 6/2019 |
| JP | 2019-153682 A | 9/2019 |
| KR | 10-0834837 B1 | 6/2008 |
| KR | 10-0929588 B | 12/2009 |
| KR | 10-2013-0055961 A | 5/2013 |
| KR | 10-2015-0121398 A | 10/2015 |
| KR | 10-2017-0124282 A | 11/2017 |
| KR | 10-1874199 B | 7/2018 |
| KR | 10-2019-0053870 A | 5/2019 |
| KR | 10-2019-0070299 A | 6/2019 |
| KR | 10-2019-0127418 A | 11/2019 |
| TW | 201934693 A | 9/2019 |

\* cited by examiner

[Fig.1]
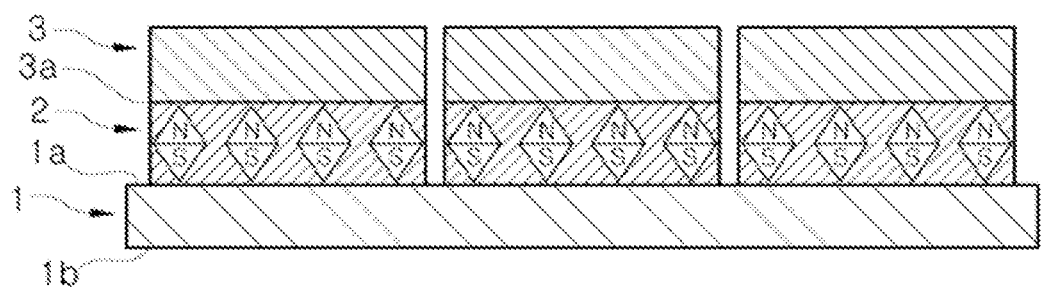
[Fig.2]
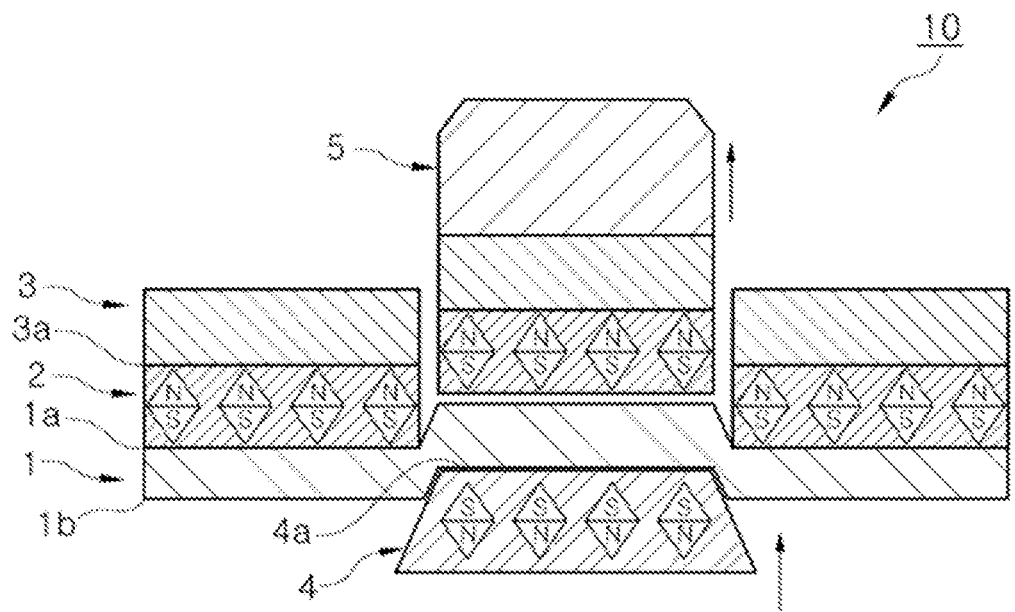

[Fig.3]
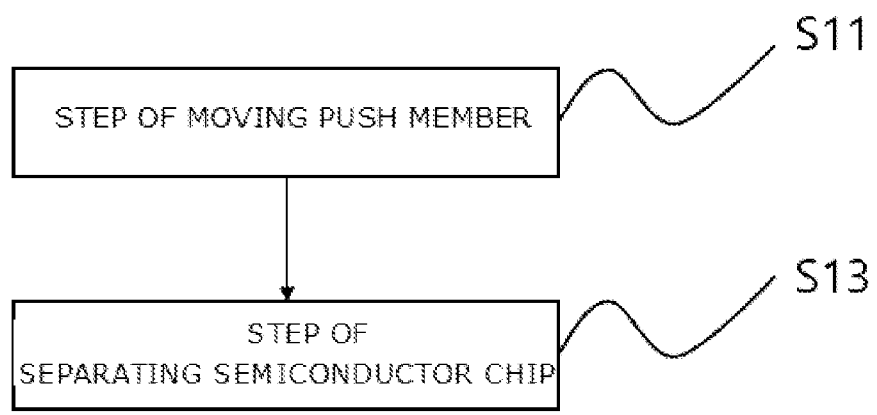

APPARATUS FOR SEPARATING SEMICONDUCTOR CHIP AND METHOD FOR SEPARATING SEMICONDUCTOR BY USING SAME

TECHNICAL FIELD

This application is a 35 U.S.C. 371 National Phase Entry Application from PCT/KR2021/001495 filed on Feb. 4, 2021, which claims the benefit of the filing date of Korean Patent Application No. 10-2020-0014526, filed with the Korean Intellectual Property Office on Feb. 6, 2020, the entire contents of which are incorporated herein by reference. The present invention relates to an apparatus for separating a semiconductor chip and a method for separating a semiconductor chip using the same.

Background of the Invention

In general, in a semiconductor manufacturing process, a process of cutting, at a chip level, several semiconductor chips integrally attached on a wafer is called a sawing process, and for the sawing process, a base member for fixing semiconductor chips to be cut, a so-called dicing tape is attached to the lower surface of the wafer.

Each semiconductor chip separated at the chip level through the sawing process is sent to a die attach process, and in the die attach process, each semiconductor chip is separated and picked up from the base member by using a pick-up unit and the like, and is transported to an electrical connection means such as a substrate and a lead frame.

Meanwhile, according to the recent trend, the size of a semiconductor chip is gradually getting smaller and the thickness thereof is also getting smaller. Furthermore, according to such a trend, the thickness of a die attach film (DAF) interposed between the semiconductor chip and the base member is also getting smaller.

As described above, as the scale of the semiconductor chip and the DAF change, the frequencies of occurrence of cracks and semiconductor chip pick-up misses are increasing in the semiconductor chip separation and pick-up process, resulting in a decrease in yield.

In the related art, in order to improve the pick-up property of an object to be picked up, the object to be picked up is pushed up with several ejectors, that is, the object to be picked up is pushed up from the bottom thereof with the ejectors, and simultaneously, a pick-up unit performs pickup by fixing the pushed object to be picked up, with vacuum, at the top of the object to be picked up. However, when the ejectors are used, there is a problem in that force is locally applied to the object to be picked up, which causes a problem in that the object to be picked up with a small thickness is broken.

The background art described above is technology information, which has been possessed by the present inventors for deriving embodiments of the present invention or acquired in the process of deriving the embodiments of the present invention, and it may not be necessarily said that the background art is a publicly-known technology disclosed to the general public prior to the filing of the application for the embodiments of the present invention.

DISCLOSURE

Brief Description of the Invention

Embodiments of the present invention provide an apparatus and a method for easily separating a semiconductor chip disposed on a base member via an adhesive member from the base member.

Problems to be solved by the present invention are not limited to the aforementioned problems, and the other unmentioned problems will be clearly understood by those skilled in the art from the following description.

An embodiment of the present invention provides a method for separating a semiconductor chip disposed on a base member via an adhesive member from the base member, the method including: a step of providing a push member on a side of the base member opposite to a side on which the semiconductor chip is disposed and moving the push member in a direction towards the semiconductor chip; and a step of separating the semiconductor chip, moved together with the push member, from the base member through a pick-up unit, wherein the adhesive member and the push member are each magnetized such that repulsive forces act on each other.

According to an embodiment of the present invention, the adhesive member and the push member may be magnetized in the thickness direction thereof.

According to an embodiment of the present invention, an upper surface of the push member may be smaller than a lower surface of the semiconductor chip.

According to an embodiment of the present invention, the adhesive member may be a die attach film (DAF).

According to an embodiment of the present invention, the die attach film may be manufactured by providing a magnetic material to a liquid mixture containing a polymer, magnetizing the magnetic material such that the magnetic material is aligned in a predetermined direction, and drying the liquid mixture.

According to an embodiment of the present invention, the pick-up unit may suck the semiconductor chip by forming vacuum therein.

An embodiment of the present invention provides an apparatus for separating a semiconductor chip disposed on a base member via an adhesive member from the base member, the apparatus including: a push member that moves the semiconductor chip by moving from the base member in a direction towards the semiconductor chip; and a pick-up unit that separates the semiconductor chip from the base member by picking up the semiconductor chip moved together with the push member, wherein the adhesive member and the push member are each magnetized such that repulsive forces act on each other, and the push member is provided on a side of the base member opposite to a side on which the semiconductor chip is disposed.

According to an embodiment of the present invention, the adhesive member and the push member may be magnetized in the thickness direction thereof.

According to an embodiment of the present invention, an upper surface of the push member may be smaller than a lower surface of the semiconductor chip.

According to an embodiment of the present invention, the adhesive member may be a die attach film (DAF).

According to an embodiment of the present invention, the die attach film may be manufactured by providing a magnetic material to a liquid mixture containing a polymer, magnetizing the magnetic material such that the magnetic material is aligned in a predetermined direction, and drying the liquid mixture.

According to an embodiment of the present invention, the pick-up unit may suck the semiconductor chip by forming vacuum therein.

Advantageous Effects

In accordance with the apparatus for separating a semiconductor chip and the method for separating a semiconductor chip using the same according to an embodiment of the present invention, it is possible to easily separate and pick up only a specific semiconductor chip to be separated and picked up from the base member without affecting other semiconductor chips around the specific semiconductor chip.

Effects of the present invention are not limited to the aforementioned effects and unmentioned effects will be clearly understood by those skilled in the art from the specification of the present application and the accompanying drawings.

BRIEF DESCRIPTION OF DRAWINGS

FIG. 1 is a view schematically illustrating a structure of a semiconductor chip disposed on a base member via an adhesive member according to an embodiment of the present invention.

FIG. 2 is a view schematically illustrating a process of separating a semiconductor chip by a push member and a pick-up unit according to an embodiment of the present invention.

FIG. 3 is a flowchart illustrating a method for separating a semiconductor chip according to an embodiment of the present invention.

DETAILED DESCRIPTION OF THE INVENTION

The present invention will become apparent by reference to the following embodiments in conjunction with the accompanying drawings. However, the present invention is not limited to such embodiments and may be realized in various forms. The embodiments to be described below are nothing but the ones provided to bring the disclosure of the present invention to perfection and assist those skilled in the art to which the present invention pertains to completely understand the scope of the present invention. The present invention is defined only by the scope of the appended claims. The terminology used herein is for the purpose of describing embodiments only and is not intended to limit the present invention. As used herein, the singular forms are intended to include the plural forms as well, unless the context clearly indicates otherwise. The terms "comprises" and/or "comprising" of stated component, step, operation and/or element, when used herein, do not exclude the presence or addition of one or more other components, steps, operations, and/or elements. The terms such as first and second may be used to describe various components, but the components are not limited by the terms. The terms are used only to distinguish one component from another component.

FIG. 1 is a view schematically illustrating a structure of a semiconductor chip disposed on a base member via an adhesive member according to an embodiment of the present invention, and FIG. 2 is a view schematically illustrating a process of separating the semiconductor chip by a push member and a pick-up unit according to an embodiment of the present invention.

Referring to FIG. 1 and FIG. 2, an embodiment of the present invention relates to a method for separating a semiconductor chip 3 disposed on a base member 1 via an adhesive member 2 from the base member 1.

FIG. 1 and FIG. 2 each illustrate several semiconductor chips obtained by cutting the semiconductor chip 3, integrally attached on a wafer, at a chip level through a sawing process.

The base member 1 for fixing semiconductor chips cut before the sawing process, a so-called a dicing tape, is attached in advance to the lower surface of the wafer. Accordingly, even after the sawing process, as illustrated in FIG. 1 and FIG. 2, the semiconductor chip 3 is attached on the base member 1 via the adhesive member 2.

The adhesive member 2 may be made of an adhesive tape, for example, a die attach film (DAF).

Meanwhile, FIG. 3 is a flowchart illustrating a method for separating a semiconductor chip according to an embodiment of the present invention. Referring to FIG. 3, the method for separating a semiconductor chip according to an embodiment of the present invention includes a step S11 of providing a push member 4 on a side 1b of the base member 1 opposite to a side 1a on which the semiconductor chip 3 is disposed and moving the push member 4 in a direction towards the semiconductor chip 3, and a step S13 of separating the semiconductor chip 3, which is moved together with the push member 4, from the base member 1 through a pick-up unit 5.

According to an embodiment of the present invention, the adhesive member 2 and the push member 4 are each magnetized such that repulsive forces act on each other.

Specifically, the adhesive member 2 and the push member 4 may be magnetized in the thickness direction thereof. For example, as illustrated in FIG. 1 and FIG. 2, the adhesive member 2 may be magnetized such that its upper side is an N pole and its lower side is an S pole in the thickness direction thereof, and the push member 4 may be magnetized such that its upper side is an S pole and its lower side is an N pole in the thickness direction thereof so as to enable a repulsive force to act on the adhesive member 2. On the contrary, the adhesive member 2 may be magnetized such that its upper side is an S pole and its lower side is an N pole in the thickness direction thereof, and the push member 4 may be magnetized such that its upper side is an N pole and its lower side is an S pole in the thickness direction thereof so as to enable a repulsive force to act on the adhesive member 2.

According to an embodiment of the present invention, the push member 4 may be magnetized in the thickness direction, which is a desired direction, by generating a magnetic field in a direction, which is opposite to a direction in which the adhesive member 2 is magnetized, by using an electromagnet. Specifically, an electromagnet, which is a member in which a coil is wound, is provided in the thickness direction of the push member 4, and a current is applied to the electromagnet to generate a magnetic field by the electromagnetic induction principle. By adjusting the predetermined magnetization direction of the adhesive member 2 and the direction of the current such that a repulsive force is generated, the semiconductor chip 3 may be separated from the base member 1 by a repulsive force between the push member 4 and the adhesive member 2. In addition, the push member 4 itself may be magnetized to generate a repulsive force with the adhesive member 2, and the push member 4 is made of a conductive material and connected to the electromagnet to generate a magnet field while a current is being applied thereto, thereby generating a repulsive force with the adhesive member 2. By magnetizing the push member 4 in the aforementioned method, the semiconductor chip 3 may be easily separated from the base member 1.

Through this, when the push member 4 is moved in the direction towards the semiconductor chip 3, the adhesive member 2 is moved by the repulsive force in a direction spaced apart from the push member 4 together with the semiconductor chip 3, so that the semiconductor chip 3 may be easily separated from the base member 1.

According to an embodiment of the present invention, preferably, an upper surface 4a of the push member 4 is smaller than a lower surface 3a of the semiconductor chip 3. This is for reducing the influence of the repulsive force between the push member 4 and the adhesive member 2 on the adhesive member 2 disposed around the push member 4.

According to an embodiment of the present invention, the die attach film (DAF) may be manufactured by providing a magnetic material to a liquid mixture containing a polymer, magnetizing the magnetic material such that the magnetic material is aligned in a predetermined direction, and then drying the liquid mixture.

According to an embodiment of the present invention, the magnetic material is dispersed in the liquid mixture containing the polymer, a coating layer is formed using the liquid mixture containing the dispersed magnetic material, and a magnetic field is applied to a lower surface of the coating layer, so that the dispersed magnetic material may be aligned with the thickness direction, which is a desired direction, as a magnetization direction. Specifically, the magnetic material is dispersed in the liquid mixture containing the polymer, the coating layer is formed with the liquid mixture containing the dispersed magnetic material, and then the magnetic field is applied to the lower surface of the coating layer, so that the dispersed magnetic material may be aligned in a direction parallel to the direction of the magnetic field. By aligning the magnetic material in the aforementioned method, the adhesive member 2 may be implemented to have magnetism in the thickness direction.

Meanwhile, according to an embodiment of the present invention, the pick-up unit 5 may be a means for sucking the semiconductor chip 3 by forming vacuum therein. Specifically, the pick-up unit 5 may be curved inward from a surface in contact with the semiconductor chip 3 to form a space, thereby sucking the semiconductor chip 3 by using the space formed as a vacuum condition.

An embodiment of the present invention provides an apparatus 10 for separating the semiconductor chip 3 disposed on the base member 1 via the adhesive member 2 from the base member 1, the apparatus 10 including: the push member 4 that moves the semiconductor chip 3 by moving from the base member 1 in a direction towards the semiconductor chip 3; and the pick-up unit 5 that separates the semiconductor chip 3 from the base member 1 by picking up the semiconductor chip 3 moved together with the push member 4, in which the adhesive member 2 and the push member 4 are each magnetized such that repulsive forces act on each other, and the push member 4 is provided on a side of the base member 1 opposite to a side on which the semiconductor chip 3 is disposed.

In accordance with the apparatus for separating a semiconductor chip according to an embodiment of the present invention, it is possible to easily separate and pick up only a specific semiconductor chip to be separated and picked up from the base member without affecting other semiconductor chips around the specific semiconductor chip.

According to an embodiment of the present invention, the adhesive member 2 and the push member 4 may be magnetized in the thickness direction thereof. Specifically, the adhesive member 2 and the push member 4 may be magnetized in the thickness direction thereof. For example, as illustrated in FIG. 1 and FIG. 2, the adhesive member 2 may be magnetized such that its upper side is an N pole and its lower side is an S pole in the thickness direction thereof, and the push member 4 may be magnetized such that its upper side is an S pole and its lower side is an N pole in the thickness direction thereof so as to enable a repulsive force to act on the adhesive member 2. On the contrary, the adhesive member 2 may be magnetized such that its upper side is an S pole and its lower side is an N pole in the thickness direction thereof, and the push member 4 may be magnetized such that its upper side is an N pole and its lower side is an S pole in the thickness direction thereof so as to enable a repulsive force to act on the adhesive member 2. As described above, since the adhesive member 2 and the push member 4 are magnetized in the thickness direction and implemented such that the repulsive force acts, when the push member 4 is moved in the direction towards the semiconductor chip 3, the adhesive member 2 is moved by the repulsive force in a direction spaced apart from the push member 4 together with the semiconductor chip 3, so that the semiconductor chip 3 may be easily separated from the base member 1.

According to an embodiment of the present invention, the push member 4 may be magnetized in the thickness direction, which is a desired direction, by generating a magnetic field in a direction, which is opposite to a direction in which the adhesive member 2 is magnetized, by using an electromagnet. Specifically, an electromagnet, which is a member in which a coil is wound, is provided in the thickness direction of the push member 4, and a current is applied to the electromagnet to generate a magnetic field by the electromagnetic induction principle. By adjusting the predetermined magnetization direction of the adhesive member 2 and the direction of the current such that a repulsive force is generated, the semiconductor chip 3 may be separated from the base member 1 by a repulsive force between the push member 4 and the adhesive member 2. In addition, the push member 4 itself may be magnetized to generate a repulsive force with the adhesive member 2, and the push member 4 is made of a conductive material and connected to the electromagnet to generate a magnet field while a current is being applied thereto, thereby generating a repulsive force with the adhesive member 2. By magnetizing the push member 4 in the aforementioned method, the semiconductor chip 3 may be easily separated from the base member 1.

According to an embodiment of the present invention, the upper surface of the push member 4 may be smaller than the lower surface of the semiconductor chip 3. As described above, the upper surface of the push member 4 is implemented to be smaller than the lower surface of the semiconductor chip 3, thereby reducing the influence of the repulsive force between the push member 4 and the adhesive member 2 on the adhesive member 2 disposed around the push member 4.

According to an embodiment of the present invention, the adhesive member 2 may be the die attach film (DAF). By selecting the adhesive member 2 as the die attach film as described above, the semiconductor chip 3 may be easily attached to a wafer.

According to an embodiment of the present invention, the die attach film (DAF) may be manufactured by providing a magnetic material to a liquid mixture containing a polymer, magnetizing the magnetic material such that the magnetic material is aligned in a predetermined direction, and then drying the liquid mixture. By manufacturing the die attach film (DAF) as described above, the magnetization direction may be easily adjusted.

According to an embodiment of the present invention, the magnetic material is dispersed in the liquid mixture containing the polymer, a coating layer is formed using the liquid mixture containing the dispersed magnetic material, and a magnetic field is applied to a lower surface of the coating layer, so that the dispersed magnetic material may be aligned with the thickness direction, which is a desired direction, as a magnetization direction. Specifically, the magnetic material is dispersed in the liquid mixture containing the polymer, the coating layer is formed with the liquid mixture containing the dispersed magnetic material, and then the magnetic field is applied to the lower surface of the coating layer, so that the dispersed magnetic material may be aligned in a direction parallel to the direction of the magnetic field. By aligning the magnetic material in the aforementioned method, the adhesive member 2 may be implemented to have magnetism in the thickness direction.

According to an embodiment of the present invention, the pick-up unit 5 may be configured to suck the semiconductor chip 3 by forming vacuum therein. Specifically, the pick-up unit 5 may be curved inward from a surface in contact with the semiconductor chip 3 to form a space, thereby sucking the semiconductor chip 3 by using the space formed as a vacuum condition. As described above, the pick-up unit 5 forms vacuum to suck the semiconductor chip 3, thereby minimizing damage to the surface of the semiconductor chip 3 and improving the pick-up property of the semiconductor chip 3 because the pick-up unit 5 is used together with the push member 4.

According to an embodiment of the present invention, it is possible to easily separate and pick up only a specific semiconductor chip to be separated and picked up from the base member without affecting other semiconductor chips around the specific semiconductor chip.

Although the present invention has been described in relation to the preferred embodiment described above, various corrections or modifications can be made without departing from the subject matter and scope of the disclosure. Therefore, the appended claims will include such corrections or modifications as long as they belong to the subject matter of the present invention.

The invention claimed is:

1. A method for separating a semiconductor chip, which is disposed on a base member via an adhesive member, from the base member, the method comprising:
    a step of providing a push member on a side of the base member opposite to a side of the base member on which the semiconductor chip is disposed and moving the push member in a direction towards the semiconductor chip; and
    a step of separating the semiconductor chip, which is moved together with the push member and the adhesive member, from the base member using a pick-up unit, wherein
    the adhesive member is disposed between the base member and the semiconductor chip,
    wherein the adhesive member and the push member are magnetized such that repulsive forces act on each other through the base member, and
    wherein the base member is not magnetized.

2. The method according to claim 1, wherein
    the adhesive member is magnetized in a thickness direction of the adhesive member, and
    the push member is magnetized in a thickness direction of the push member.

3. The method according to claim 1, wherein an upper surface of the push member is smaller than a lower surface of the semiconductor chip.

4. The method according to claim 1, wherein the adhesive member is a die attach film (DAF).

5. The method according to claim 4, wherein the die attach film is manufactured by providing a magnetic material to a liquid mixture containing a polymer, magnetizing the magnetic material such that the magnetic material is aligned in a predetermined direction, and drying the liquid mixture.

6. The method according to claim 1, wherein the pick-up unit is configured to suck the semiconductor chip by forming vacuum within a space formed by the pick-up unit and the semiconductor chip.

7. An apparatus for separating a semiconductor chip, which is disposed on a non-magnetized base member via an adhesive member, from the non-magnetized base member, the apparatus comprising:
    a push member that is configured to move the semiconductor chip in a direction towards the semiconductor chip; and
    a pick-up unit that is configured to separate the semiconductor chip from the non-magnetized base member by picking up the semiconductor chip which is moved together with the push member and the adhesive member, wherein
    the adhesive member is disposed between the non-magnetized base member and the semiconductor chip,
    the adhesive member disposed between the non-magnetized base member and the semiconductor chip, and the push member are each magnetized such that repulsive forces act on each other through the non-magnetized base member, and
    the push member is provided on a side of the non-magnetized base member opposite to a side on which the semiconductor chip is disposed.

8. The apparatus according to claim 7, wherein
    the adhesive member is magnetized in a thickness direction of the adhesive member, and
    the push member is magnetized in a thickness direction of the push member.

9. The apparatus according to claim 7, wherein an upper surface of the push member is smaller than a lower surface of the semiconductor chip.

10. The apparatus according to claim 7, wherein the adhesive member is a die attach film (DAF).

11. The apparatus according to claim 10, wherein the die attach film is manufactured by providing a magnetic material to a liquid mixture containing a polymer, magnetizing the magnetic material such that the magnetic material is aligned in a predetermined direction, and drying the liquid mixture.

12. The apparatus according to claim 7, wherein the pick-up unit is configured to suck the semiconductor chip by forming vacuum within a space formed by the pick-up unit and the semiconductor chip.

13. A method for separating a semiconductor chip disposed on a base member via an adhesive member from the base member, the method comprising:
    a step of providing a push member on a side of the base member opposite to a side on which the semiconductor chip is disposed and moving the push member in a direction towards the semiconductor chip; and
    a step of separating the semiconductor chip, moved together with the push member, from the base member through a pick-up unit, wherein
    the adhesive member and the push member are each magnetized such that repulsive forces act on each other,
    the adhesive member is a die attach film (DAF), and
    the die attach film is manufactured by providing a magnetic material to a liquid mixture containing a polymer, magnetizing the magnetic material such that the magnetic material is aligned in a predetermined direction, and drying the liquid mixture.

* * * * *